(12) United States Patent
Norouzpourshirazi et al.

(10) Patent No.: US 12,470,230 B2
(45) Date of Patent: Nov. 11, 2025

(54) SYSTEMS AND METHODS FOR PRECHARGING DRIVER CIRCUITRY FOR AN ANALOG-TO-DIGITAL CONVERTER

(71) Applicant: Cirrus Logic International Semiconductor Ltd., Edinburgh (GB)

(72) Inventors: Arashk Norouzpourshirazi, Austin, TX (US); Axel Thomsen, Austin, TX (US); John L. Melanson, Austin, TX (US)

(73) Assignee: Cirrus Logic Inc., Austin, TX (US)

(*) Notice: Subject to any disclaimer, the term of this patent is extended or adjusted under 35 U.S.C. 154(b) by 84 days.

(21) Appl. No.: 18/420,033

(22) Filed: Jan. 23, 2024

(65) Prior Publication Data

US 2025/0240027 A1    Jul. 24, 2025

(51) Int. Cl.
*H03M 1/12*    (2006.01)

(52) U.S. Cl.
CPC ................................. *H03M 1/1245* (2013.01)

(58) Field of Classification Search
CPC .................................................. H03M 1/1245
USPC ......................................................... 341/155
See application file for complete search history.

(56) References Cited

U.S. PATENT DOCUMENTS

| | | | |
|---|---|---|---|
| 8,502,594 B2 | 8/2013 | Steensgaard-Madsen | |
| 8,525,574 B1 | 9/2013 | Duggal | |
| 9,484,905 B1 | 11/2016 | Mal | |
| 10,069,483 B1* | 9/2018 | Zanbaghi | H03M 1/1245 |
| 10,187,940 B2* | 1/2019 | Polley | A61B 5/14551 |
| 10,277,244 B1* | 4/2019 | Srivastava | H03G 3/3089 |
| 10,742,227 B1* | 8/2020 | Schifmann | H03M 1/1215 |
| 2006/0202735 A1 | 9/2006 | Askin et al. | |
| 2012/0268304 A1* | 10/2012 | Lin | H03F 3/005 341/172 |
| 2014/0070976 A1 | 3/2014 | Hurrell et al. | |

(Continued)

FOREIGN PATENT DOCUMENTS

| | | |
|---|---|---|
| EP | 3203480 A1 | 8/2017 |
| WO | 2018071479 A1 | 4/2018 |

OTHER PUBLICATIONS

Combined Search and Examination Report under Sections 17 and 18(3), UKIPO, Application No. GB2302512.5, mailed Aug. 21, 2023.

(Continued)

*Primary Examiner* — Jean B Jeanglaude
(74) *Attorney, Agent, or Firm* — Jackson Walker L.L.P.

(57) ABSTRACT

An ADC may include an analog front end (AFE) configured to receive an analog input signal and sample the input signal to generate an analog sampled signal comprising a plurality of analog samples and conversion circuitry configured to convert each analog sample to a respective digital sample during a conversion phase. The AFE may include an amplifier configured to receive and buffer the input signal to generate an analog output signal and sampling circuitry configured to sample each of the plurality of analog output samples onto a sampling capacitor during a sampling phase. The AFE may also include precharging circuitry configured to, during the conversion phase, track the analog input signal and store a charge on a precharging capacitor, the charge based on the analog input signal, and during a precharging transfer phase, transfer at least a portion of the charge stored on the precharging capacitor to the sampling capacitor.

20 Claims, 7 Drawing Sheets

(56) References Cited

U.S. PATENT DOCUMENTS

| | | | |
|---|---|---|---|
| 2015/0097596 A1* | 4/2015 | Rysinski | H03K 5/2481 327/50 |
| 2017/0077803 A1 | 3/2017 | Stulik et al. | |
| 2024/0048108 A1 | 2/2024 | Norpouzpourshirazi et al. | |
| 2024/0053387 A1 | 2/2024 | Norouzpourshirazi | |

OTHER PUBLICATIONS

Search Report under Section 17, UKIPO, Application No. GB2500136.3, mailed Jun. 17, 2025.
Examination Report under Section 18(3), UKIPO, Application No. GB2302512.5, dated May 31, 2024.

* cited by examiner

SYSTEMS AND METHODS FOR PRECHARGING DRIVER CIRCUITRY FOR AN ANALOG-TO-DIGITAL CONVERTER

FIELD OF DISCLOSURE

The present disclosure relates in general to the field of electronics, and more specifically to systems and methods for precharging driver circuitry for an analog-to-digital converter (ADC).

BACKGROUND

Analog-to-digital converters (ADCs) are often used in electronic circuits to convert an analog electrical quantity (e.g., a voltage or current) into an equivalent digital signal. ADCs often include an analog front end comprising an input analog driver (e.g., amplifier) for driving an analog signal and a sampling network of switched capacitors for sampling the output of the input analog driver, with the analog front end followed by conversion circuitry (e.g., comparators, quantizers, etc.) for converting a sampled analog signal into its digital equivalent signal.

Existing approaches for analog front ends must often be designed to trade off among power consumption, speed, and accuracy of the analog front end. For example, in one architecture, the input analog driver may directly drive the switched capacitors of the sampling network, which may require high power consumption, high bandwidth, and high slew-rate current in order to achieve settling accuracy. In another approach, the input analog driver may drive a large output capacitor which may in turn drive sampling capacitors of the sampling network. Such an architecture may have a lower bandwidth approach as opposed to the direct-drive approach depending on the signal band of interest, and may have power savings over the direct-drive approach, but may also require a very large output capacitor for signal accuracy.

Accordingly, improved approaches for analog front ends of ADCs may be desired.

SUMMARY

In accordance with the teachings of the present disclosure, certain disadvantages and problems associated with existing approaches for analog front ends of ADCs may be reduced or eliminated.

In accordance with embodiments of the present disclosure, an analog-to-digital converter may include an analog front end configured to receive an analog input signal and sample the input signal to generate an analog sampled signal comprising a plurality of analog samples and conversion circuitry configured to convert each analog sample to a respective digital sample of a digital output signal during a conversion phase of the analog-to-digital converter. The analog front end may include an amplifier configured to receive and buffer the analog input signal to generate an analog output signal and sampling circuitry configured to sample each of the plurality of analog output samples onto a sampling capacitor of the sampling circuitry during a sampling phase of the analog-to-digital converter. The analog front end may also include precharging circuitry configured to, during the conversion phase, track the analog input signal and store a charge on a precharging capacitor of the precharging circuitry, the charge based on the analog input signal, and during a precharging transfer phase of the analog-to-digital converter, transfer at least a portion of the charge stored on the precharging capacitor to the sampling capacitor.

In accordance with these and other embodiments of the present disclosure, a method may be provided for an analog-to-digital converter having an analog front end configured to receive an analog input signal and sample the input signal to generate an analog sampled signal comprising a plurality of analog samples and conversion circuitry configured to convert each analog sample to a respective digital sample of a digital output signal during a conversion phase of the analog-to-digital converter, further wherein the analog front end comprises an amplifier configured to receive and buffer the analog input signal to generate an analog output signal and sampling circuitry configured to sample each of the plurality of analog output samples onto a sampling capacitor of the sampling circuitry during a sampling phase of the analog-to-digital converter. The method may include, during the conversion phase, tracking the analog input signal and storing a charge on a precharging capacitor of the precharging circuitry, the charge based on the analog input signal. The method may also include, during a precharging transfer phase of the analog-to-digital converter, transferring at least a portion of the charge stored on the precharging capacitor to the sampling capacitor.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
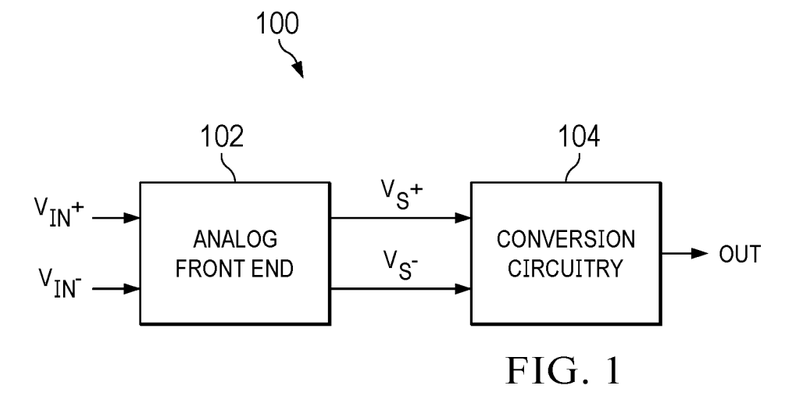
FIG. 1 illustrates a block diagram of an example ADC, in accordance with embodiments of the present disclosure.

FIG. 1 illustrates a block diagram of an example ADC 100, in accordance with embodiments of the present disclosure. As shown in FIG. 1, ADC 100 may include an analog front end 102 and conversion circuitry 104.

Analog front end 102 may comprise any suitable system, device, or apparatus configured to receive an input signal $V_{IN}=V_{IN}^{+}-V_{IN}^{-}$ and periodically sample input signal $V_{IN}$ to generated sampled signal $V_S=V_S^{+}-V_S^{-}$. Examples of analog front end 102 are disclosed in greater detail below.

Conversion circuitry 104 may include any suitable system, device, or apparatus configured to convert samples of sampled signal $V_S$ generated by analog front end 102 into corresponding samples of a digital signal OUT, each corresponding sample having an encoding representative of its respective sample of sampled signal $V_S$. For example, conversion circuitry 104 may include one or more comparators, quantizers, integrators, and/or other components.

For the purposes of clarity and exposition, analog signals have been represented in FIG. 1 and may be represented in the following figures using a symbol "V," which may indicate a voltage signal. However, it is understood that an analog process may receive an analog signal other than a voltage signal (e.g., a current signal) and/or may generate a sampled signal other than a sampled voltage signal (e.g., a sampled current signal).

Figure 2:
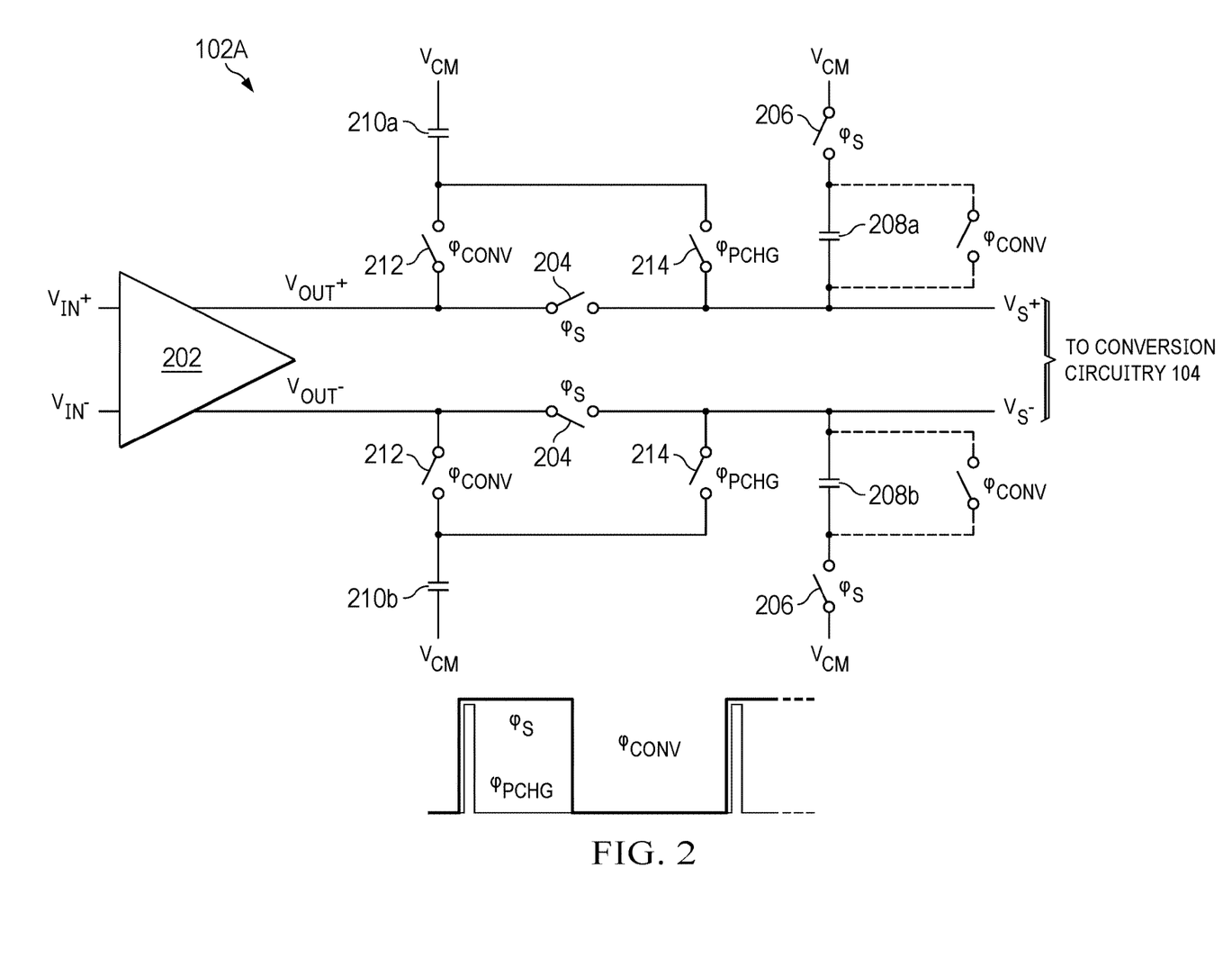
FIG. 2 illustrates a block diagram of an example analog front end of an ADC, in accordance with embodiments of the present disclosure.

FIG. 2 illustrates a block diagram of an example analog front end 102A of an ADC, in accordance with embodiments of the present disclosure. In some embodiments, analog front end 102A may be used to implement analog front end 102.

As shown in FIG. 2, analog front end 102A may include an amplifier 202 and a sampling network comprising a plurality of switches and a plurality of capacitors. Amplifier 202 may include any system, device, or apparatus configured to receive input signal $V_{IN}$ and generate an output signal $V_{OUT}=V_{OUT}^{+}-V_{OUT}^{-}$ proportional to input signal $V_{IN}$. In some embodiments, amplifier 202 may have a unity gain such that output signal $V_{OUT}$ is approximately equal to input signal $V_{IN}$.

The switched capacitor network of analog front end 102A may generally operate in accordance with a sampling clock signal $\varphi_S$, the complement of which is a conversion clock signal $\varphi_{CONV}$. Each of clock signals $\varphi_S$ and $\varphi_{CONV}$ may comprise a square-wave signal, as shown in FIG. 2. Clock signals $\varphi_S$ and $\varphi_{CONV}$ may define clock cycles operating at a sampling rate wherein each clock cycle includes a sampling phase when sampling clock signal $\varphi_S$ is asserted and conversion clock signal $\varphi_{CONV}$ is deasserted and a conversion phase when sampling clock signal $\varphi_S$ is deasserted and conversion clock signal $\varphi_{CONV}$ is asserted. Generally, during the sampling phase of each clock cycle, sampling switches 204 and 206 may close and charges proportional to the components $V_{OUT}^{+}$ and $V_{OUT}^{-}$ of output signal $V_{OUT}$ may be sampled onto sampling capacitors 208a and 208b, respectively, with a common mode voltage $V_{CM}$ applied to a plate of each of sampling capacitors 208. During the conversion phase of each cycle, sampled analog signal $V_S$ may be received and processed by conversion circuitry 104.

As shown in FIG. 2, the sampling network of analog front end 102A may optionally include reset switches (shown connected by dashed lines) configured to reset voltages across sampling capacitors 208a and 208b at some point during the conversion phase, or otherwise deplete the sampled charge during conversion.

Also as shown in FIG. 2, the sampling network of analog front end 102A may include a precharging network comprising precharge capacitors 210a and 210b with common mode voltage $V_{CM}$ applied to a plate of each of precharge capacitors 210. During the conversion phase of each cycle, precharging storage switches 212 may close such that precharge capacitors 210 may each tap a respective component $V_{OUT}^{+}$ and $V_{OUT}^{-}$ of output signal $V_{OUT}$ to track output signal $V_{OUT}$ during the conversion phase. Subsequently, during a precharge transfer subphase $\varphi_{PCHG}$ near the beginning of the sampling phase, precharging transfer switches 214 may close and charge stored on precharge capacitors 210a and 210b may be at least partially transferred to sampling capacitors 208a and 208b via precharging transfer switches 214. Thus, precharge capacitors 210 may provide for practically instant charging of sampling capacitors 208, reducing an amount of charge required from amplifier 202 in order to accurately sample output signal $V_{OUT}$ onto sampling capacitors 208. As a result, compared to existing approaches, amplifier 202 may be designed with a lower power consumption in order to provide the same settling accuracy at the same speed as existing approaches.

Although FIG. 2 depicts precharge transfer subphase $\varphi_{PCHG}$ occurring within the duration of the sampling phase in which sampling clock signal $\varphi_S$ is asserted, in some embodiments, precharge transfer subphase $\varphi_{PCHG}$ may fall outside of the duration of the sampling phase in which sampling clock signal $\varphi_S$ is asserted, and thus in such embodiments, the assertion of sampling clock signal $\varphi_S$ may not begin until precharge transfer subphase $\varphi_{PCHG}$ has completed.

Figure 3A:
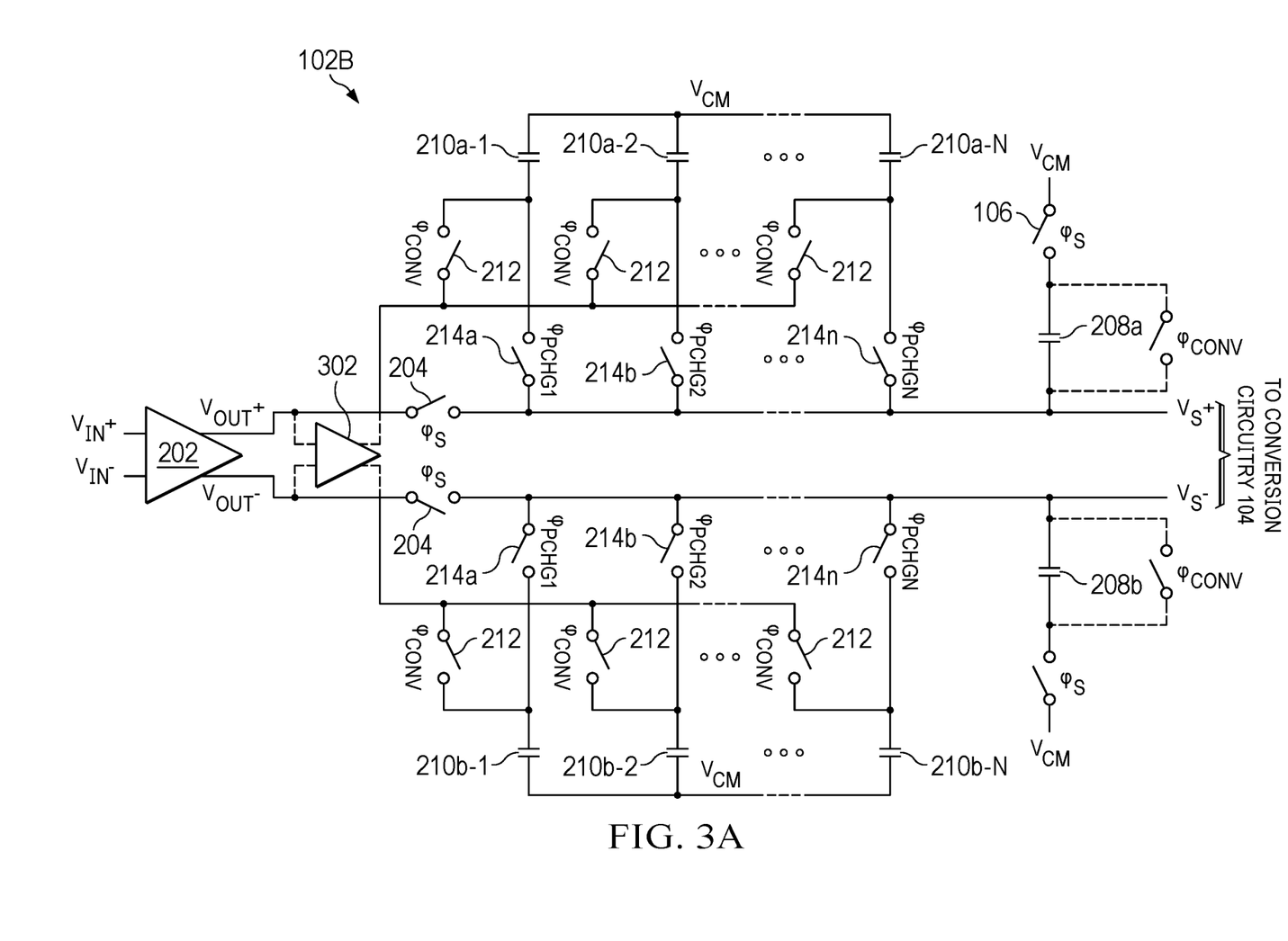
FIGS. 3A and 3B (which may be referred to herein collectively as FIG. 3) illustrate a block diagram of another example analog front end of an ADC, in accordance with embodiments of the present disclosure.
Figure 3B:
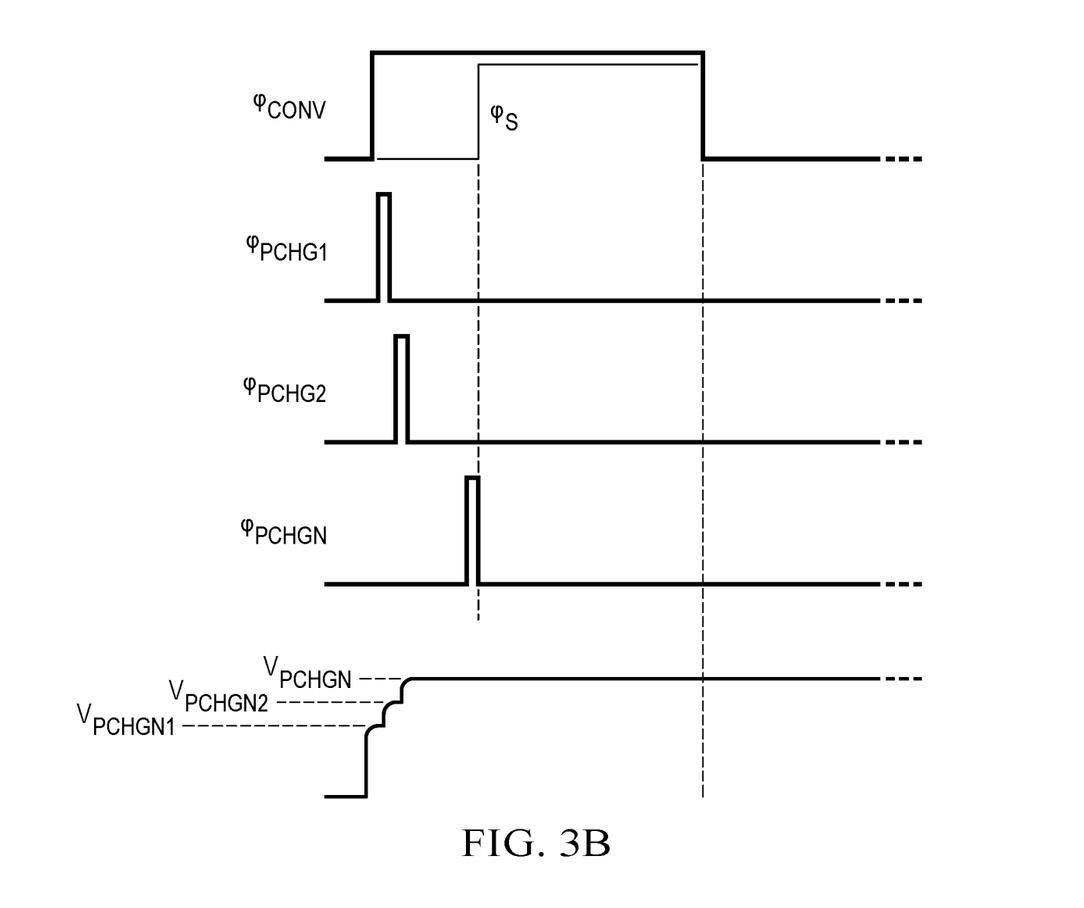

FIG. 3 illustrates a block diagram of an example analog front end 102B of an ADC, in accordance with embodiments of the present disclosure. In some embodiments, analog front end 102B may be used to implement analog front end 102. Analog front end 102B may be similar in many respects to analog front end 102A, and only certain differences between analog front end 102B and analog front end 102A may be discussed below.

One difference between analog front end 102B and analog front end 102A may be that analog front end 102B may include multiple precharge capacitors 210 that may be used in consecutive precharge transfer subphases, wherein each precharge transfer subphase provides an incremental portion of a target precharging level of sampling capacitors 208a and 208b, for example in a geometric sequence. During the conversion phase of each cycle, precharging storage switches 212 may close such that precharge capacitors 210 may each tap a respective component $V_{OUT}^{+}$ and $V_{OUT}^{-}$ of output signal $V_{OUT}$ to track output signal $V_{OUT}$ during the conversion phase. Then, in a first precharge transfer subphase $\varphi_{PCHG1}$, precharging transfer switches 214a may close and charge stored on precharge capacitors 210a-1 and 210b-1 may be at least partially transferred to sampling capacitors 208a and 208b via precharging transfer switches 214a (e.g., precharging sampling capacitor 208a and/or sampling capacitor 208b to one-half of their target values for the sampling period). Next, in a second precharge transfer subphase $\varphi_{PCHG2}$, precharging transfer switches 214b may close and charge stored on precharge capacitors 210a-2 and 210b-2 may be at least partially transferred to sampling capacitors 208a and 208b via precharging transfer switches 214b (e.g., precharging sampling capacitor 208a and/or sampling capacitor 208b to three-quarters of their target values for the sampling period). Zero or more additional precharge transfer subphases may follow, each providing an incremental portion of a target precharging level of sampling capacitors 208a and 208b.

FIG. 3 depicts that the precharge transfer subphases $\varphi_{PCHG1}, \varphi_{PCHG2}, \ldots, \varphi_{PCHGN}$, may occur during a portion of a sampling phase in which sampling clock signal $\varphi_S$ is deasserted. However, in some embodiments, one or more of precharge transfer subphases $\varphi_{PCHG1}, \varphi_{PCHG2}, \ldots, \varphi_{PCHGN}$ may occur during a portion of a sampling phase in which sampling clock signal $\varphi_S$ is asserted.

Further, another difference between analog front end 102B and analog front end 102A may be that, in some embodiments, analog front end 102B may include an auxiliary amplifier 302 which may be used to, during the conversion/tracking phase, charge precharge capacitors 210. Such auxiliary amplifier 302 may be lower-power and less accurate than main amplifier 202, and because main amplifier 202 ultimately drives sampling capacitors 208, noise performance may be determined by main amplifier 202. In other embodiments, auxiliary amplifier 302 may be absent from analog front end 102B, and precharge capacitors 210 may instead be charged during the conversion/tracking phase by amplifier 202.

It is further noted that while FIG. 2 does not depict an auxiliary amplifier analogous to auxiliary amplifier 302, in some embodiments, analog front end 102A may include an auxiliary amplifier, such as auxiliary amplifier 302, for charging precharge capacitors 210 during the conversion/tracking phase.

The precharging techniques discussed above may have advantages over the approaches discussed in the Background section. For example, while one existing approach requires a large capacitor external to the ADC integrated circuit, the precharging techniques disclosed herein may not require components external to the ADC integrated circuit, which may provide area savings due to not requiring a pad of the ADC integrated circuit for the capacitor. The precharging techniques disclosed herein may also enable a minimal gain error for an analog front end at lower power and with higher signal bandwidth as compared to traditional approaches.

Figure 4:
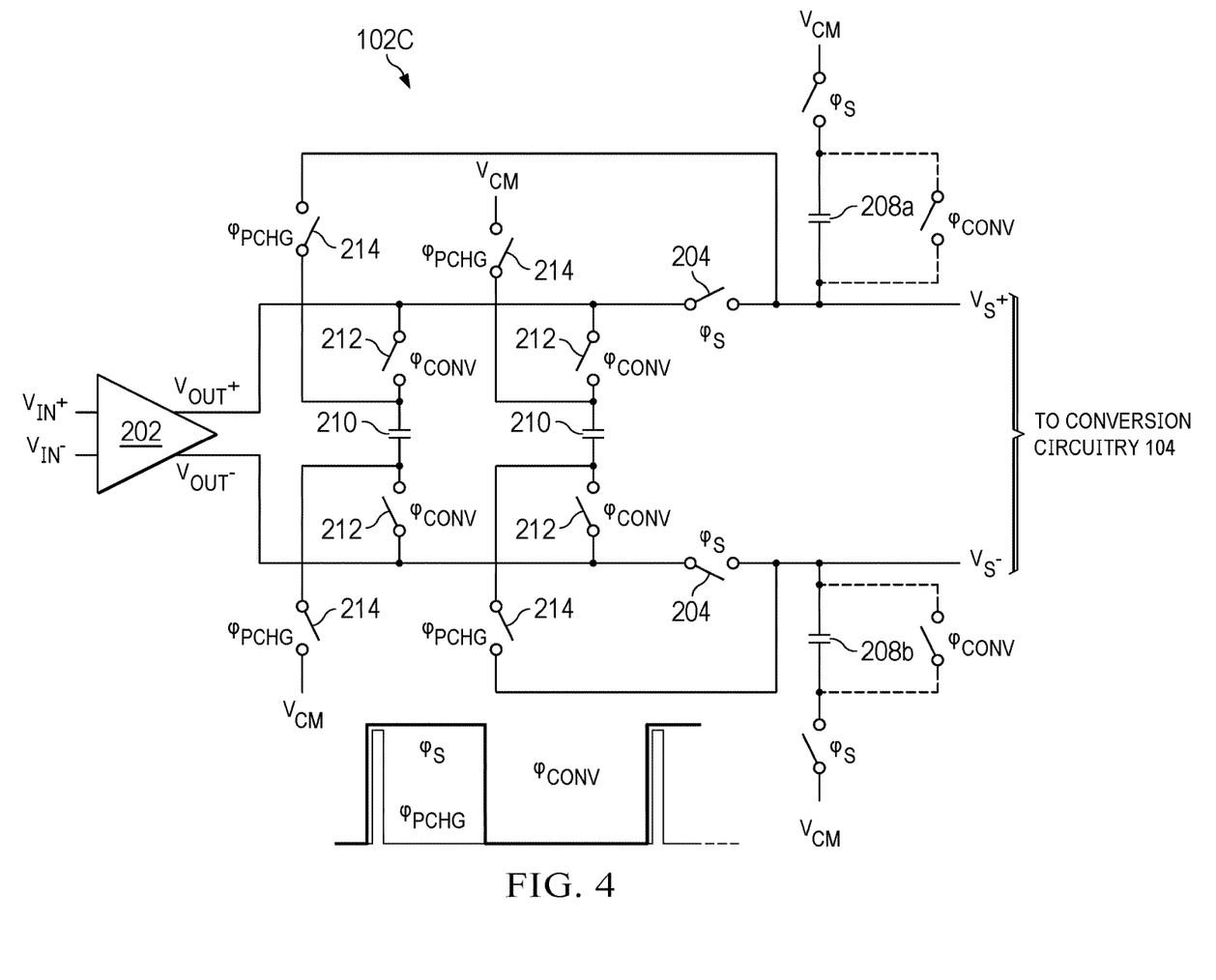
FIG. 4 illustrates a block diagram of an additional example analog front end of an ADC, in accordance with embodiments of the present disclosure.

FIG. 4 illustrates a block diagram of an example analog front end 102C of an ADC, in accordance with embodiments of the present disclosure. In some embodiments, analog front end 102C may be used to implement analog front end 102. Analog front end 102C may be similar in many respects to analog front end 102A, and only certain differences between analog front end 102C and analog front end 102A may be discussed below.

One difference between analog front end 102C and analog front end 102A may be that in analog front end 102C, precharge capacitors 210, precharging storage switches 212, and precharging transfer switches 214 may be arranged to enable differential precharging. In other words, during a precharge transfer subphase $\varphi_{PCHG}$ (which is shown in FIG. 4 as overlapping with the assertion of sampling clock signal $\varphi_S$, but could in some embodiments be non-overlapping with the assertion of sampling clock signal $\varphi_S$), precharging transfer switches 214 may close, such that each precharge capacitor 210 is placed in parallel with a respective sampling capacitor 208, with proper polarities. Assuming the capacitances of precharge capacitors 210 and sampling capacitors 208 are approximately equal, precharge capacitors 210 may each be charged with twice the pseudo-differential value of each output of amplifier 202. Accordingly, each sampling capacitor 208 may be precharged to one times the pseudo-differential value of each output, which may be approximately equal to the final desired sample in a very short amount of time, with the accuracy of the precharging depending on matching of the capacitances of precharge capacitors 210 and sampling capacitors 208.

While the foregoing contemplates the capacitances of precharge capacitors 210 and sampling capacitors 208 being approximately equal, other ratios between capacitance of precharge capacitors 210 and capacitance of sampling capacitor 208 may be used.

It is noted that the differential precharging approach set forth in FIG. 4 may require the use of a beyond-the-rails switch for precharging transfer switches 214. An example of such a beyond-the-rails switch is disclosed in U.S. patent application Ser. No. 17/881,845, filed Aug. 5, 2022, which is incorporated by reference herein in its entirety.

It is further noted that while FIG. 4 does not depict an auxiliary amplifier analogous to auxiliary amplifier 302 of FIG. 3, analog front end 102C may, in some embodiments, include an auxiliary amplifier for charging precharge capacitors 210 during the conversion/tracking phase.

It is also noted that while FIG. 4 depicts only a single precharge transfer subphase $\varphi_{PCHG}$ for purposes of clarity and exposition, in some embodiments, analog front end 102C may employ multiple precharge transfer subphases in a manner similar or identical to that depicted in FIG. 3.

Figure 5:
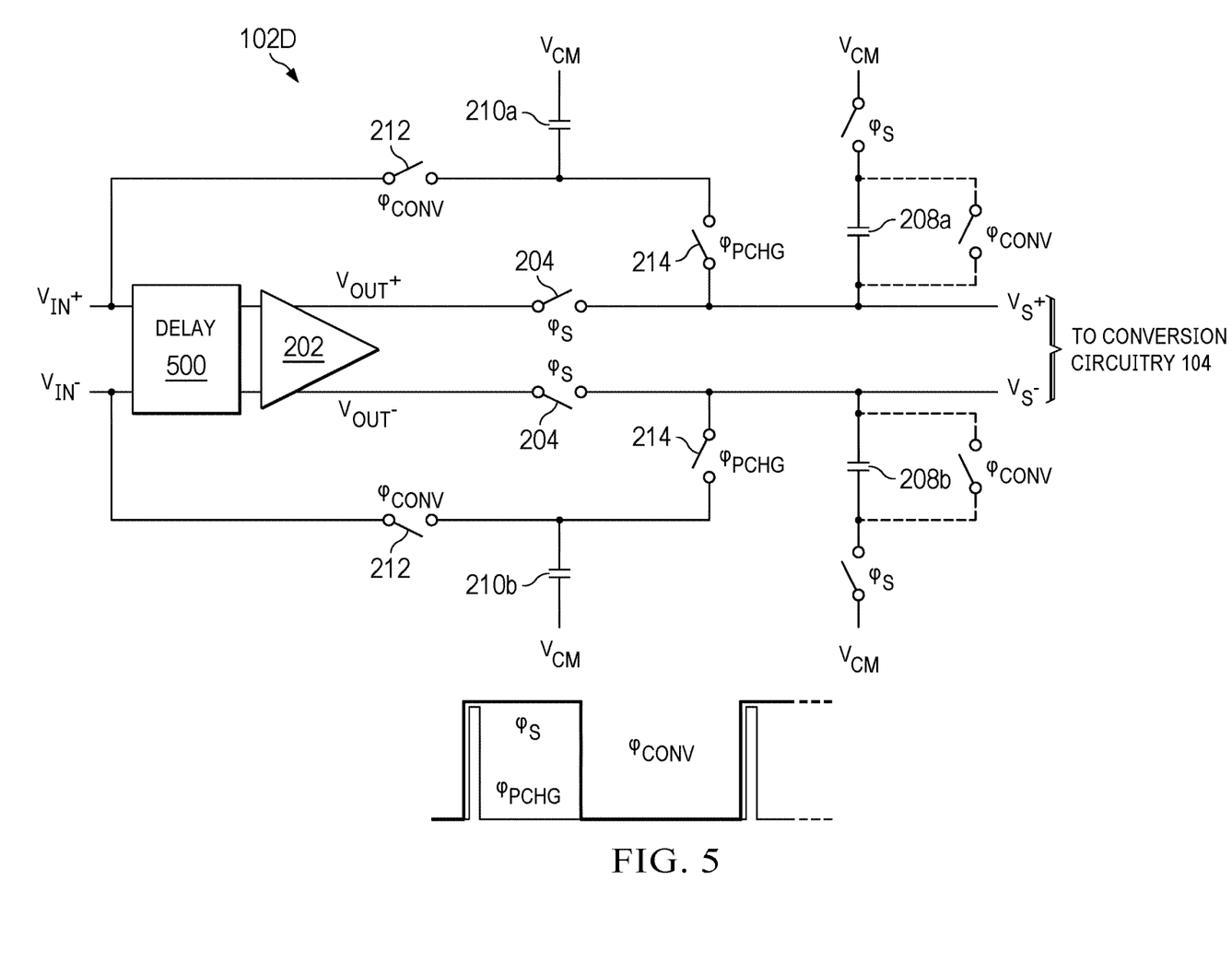
FIG. 5 illustrates a block diagram of a further example analog front end of an ADC, in accordance with embodiments of the present disclosure.

FIG. 5 illustrates a block diagram of an example analog front end 102D of an ADC, in accordance with embodiments of the present disclosure. In some embodiments, analog front end 102D may be used to implement analog front end 102. Analog front end 102D may be similar in many respects to analog front end 102A, and only certain differences between analog front end 102D and analog front end 102A may be discussed below.

One difference between analog front end 102D and analog front end 102A may be that analog front end 102D includes a delay element 500 inserted between input signal $V_{IN}$ and the input terminals of amplifier 202. Accordingly, precharging, including both storing of charge on precharge capacitors 210 during the conversion/tracking phase and transfer of charge from precharge capacitors 210 to sampling capacitors 208 during precharge transfer subphase $\varphi_{PCHG}$, may be performed before the delay imposed by delay element 500 while sampling onto sampling capacitors 208 is performed after the delay imposed by delay element 500. Such presence of delay element 500 may enable precharging for higher input frequencies, even up to the Nyquist rate.

Delay element 500 may be implemented in any suitable manner, including in some embodiments with a passive resistive-capacitive multi-order filter that provides a proper phase shift (e.g., 90 degrees) to input signal $V_{IN}$, such that the precharged voltage and the sampled output of amplifier 202 are approximately the same.

While FIG. 5 depicts that the precharge transfer subphase $\varphi_{PCHG}$ may overlap with the assertion of sampling clock signal $\varphi_S$, in some embodiments precharge transfer subphase $\varphi_{PCHG}$ may be non-overlapping with sampling clock signal $\varphi_S$.

It is also noted that while FIG. 5 depicts only a single precharge transfer subphase $\varphi_{PCHG}$ for purposes of clarity and exposition, in some embodiments, analog front end 102D may employ multiple precharge transfer subphases in a manner similar or identical to that depicted in FIG. 3.

Figure 6:
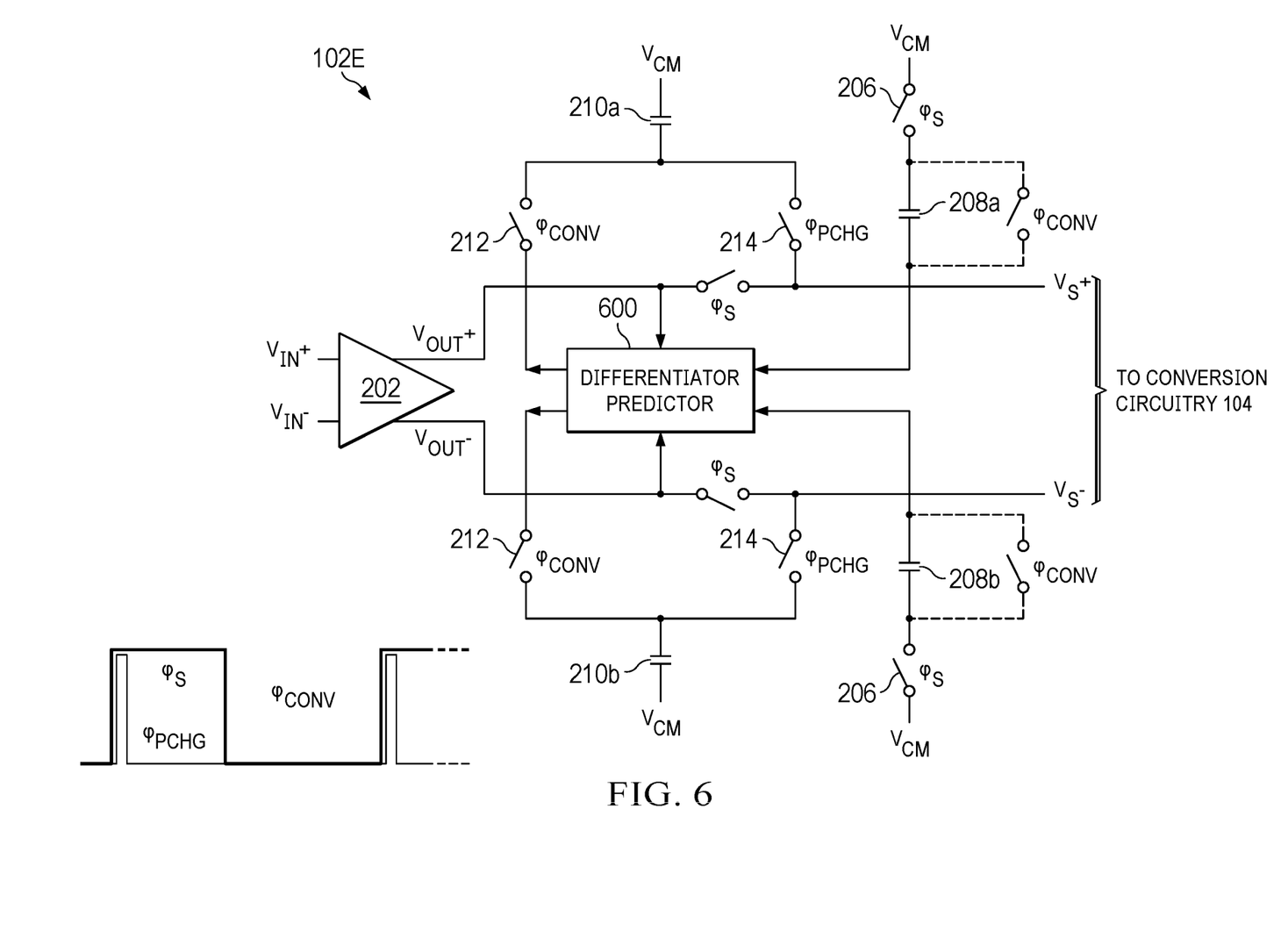
FIG. 6 illustrates a block diagram of yet another example analog front end of an ADC, in accordance with embodiments of the present disclosure.

FIG. 6 illustrates a block diagram of an example analog front end 102E of an ADC, in accordance with embodiments of the present disclosure. In some embodiments, analog front end 102E may be used to implement analog front end 102. Analog front end 102E may be similar in many respects to analog front end 102A, and only certain differences between analog front end 102E and analog front end 102A may be discussed below.

One difference between analog front end 102E and analog front end 102A may be that analog front end 102E includes a differentiator predictor 600 configured to receive as inputs a current sample of sampled signal $V_S$ and output signal $V_{OUT}$, and predict the value of the next sample of sampled signal $V_S$, for example based on an instantaneous slope of output signal $V_{OUT}$, in order to charge precharge capacitors 210 to approximately the signal value of the next sample. Such differentiator prediction may enable precharging for higher input frequencies, even up to the Nyquist rate.

While FIG. 6 depicts that the precharge transfer subphase $\varphi_{PCHG}$ may overlap with the assertion of sampling clock signal $\varphi_S$, in some embodiments precharge transfer subphase $\varphi_{PCHG}$ may be non-overlapping with sampling clock signal $\varphi_S$.

It is also noted that while FIG. 6 depicts only a single precharge transfer subphase $\varphi_{PCHG}$ for purposes of clarity and exposition, in some embodiments, analog front end 102E may employ multiple precharge transfer subphases in a manner similar or identical to that depicted in FIG. 3.

Using the systems and methods described above, a sampling capacitor of an ADC may be precharged at high speed and high settling accuracy, in order to lower power consumption of an analog front end of the ADC, as compared to existing approaches.

As described above, the precharging approach may utilize the analog front end of an ADC in both tracking/conversion and sampling phases. At the beginning of (or prior to) sampling, the systems and methods herein may provide for a quick charge transfer between a precharging capacitor, and a sampling capacitor may provide a portion of an overall target charge to be sampled onto the sampling capacitor, leaving a smaller portion of the target charge to be delivered by analog front end circuitry during the sampling phase. During the tracking/conversion phase, the precharging capacitor may track the target output to be sampled, either directly or through a coarse auxiliary buffer.

In some embodiments, precharging may be performed in multiple consecutive precharge transfer subphases, wherein the precharging transfer phases each provide a closer approximation to the target charge.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An analog-to-digital converter comprising:
an analog front end configured to receive an analog input signal and sample the analog input signal to generate an analog sampled signal comprising a plurality of analog samples; and
conversion circuitry configured to convert each analog sample to a respective digital sample of a digital output signal during a conversion phase of the analog-to-digital converter;
wherein the analog front end comprises:
an amplifier configured to receive and buffer the analog input signal to generate an analog output signal; and
sampling circuitry configured to sample each of the plurality of analog output samples onto a sampling capacitor of the sampling circuitry during a sampling phase of the analog-to-digital converter; and
precharging circuitry configured to:
during the conversion phase, track the analog input signal and store a charge on a precharging capacitor of the precharging circuitry, the charge based on the analog input signal; and
during a precharging transfer phase of the analog-to-digital converter, transfer at least a portion of the charge stored on the precharging capacitor to the sampling capacitor.

2. The analog-to-digital converter of claim 1, wherein the precharging transfer phase is overlapping with the sampling phase.

3. The analog-to-digital converter of claim 1, wherein the precharging transfer phase is non-overlapping with the sampling phase.

4. The analog-to-digital converter of claim 1, wherein the analog front end further comprises an auxiliary amplifier configured to receive and buffer the analog output signal and wherein the precharging circuitry tracks the analog input signal by tracking the output of the auxiliary amplifier.

5. The analog-to-digital converter of claim 1, wherein the analog front end further comprises an auxiliary amplifier configured to receive and buffer the analog input signal and wherein the precharging circuitry tracks the analog input signal by tracking the outputs of one or more of the main amplifier and the auxiliary amplifier.

6. The analog-to-digital converter of claim 1, wherein the precharging circuitry is further configured to:
during the conversion phase, store a respective charge on each of a plurality of precharging capacitors comprising the precharging capacitor of the precharging circuitry, the charge based on the analog input signal; and
during each of a plurality of successive precharging transfer phases comprising the precharging transfer phase, transfer the at least a portion of the charge stored on one of the plurality of precharging capacitors to the sampling capacitor.

7. The analog-to-digital converter of claim 1, wherein the precharging circuitry is further configured to:
during the conversion phase, track the analog output signal and store the charge differentially on the precharging capacitor and a second precharging capacitor of the precharging circuitry, the charge based on the analog output signal; and
during the precharging transfer phase, place the precharging capacitor in parallel with the sampling capacitor and the second precharging capacitor in parallel with a second sampling capacitor to transfer the at least a portion of the charge stored on the precharging capacitor to the sampling capacitor and transfer the at least a portion of the charge stored on the second precharging capacitor to the second sampling capacitor.

8. The analog-to-digital converter of claim 1, wherein the analog front end further comprises a delay element between an input for receiving the input analog signal and input terminals of the amplifier, and wherein the precharging circuitry is further configured to during the conversion phase, track the analog input signal by sampling the input analog signal with a delay imposed by the delay element.

9. The analog-to-digital converter of claim 1, wherein the analog front end further comprises a predictor circuit configured to predict, based on a current sample of the analog sampled signal, a target value for a next sample of the analog sampled signal, wherein the charge is based on the target value predicted.

10. The analog-to-digital converter of claim 9, wherein the predictor circuit comprises a differentiator.

11. A method comprising, in an analog-to-digital converter having an analog front end configured to receive an analog input signal and sample the analog input signal to generate an analog sampled signal comprising a plurality of analog samples and conversion circuitry configured to convert each analog sample to a respective digital sample of a digital output signal during a conversion phase of the analog-to-digital converter, further wherein the analog front end comprises an amplifier configured to receive and buffer the analog input signal to generate an analog output signal and sampling circuitry configured to sample each of the plurality of analog output samples onto a sampling capacitor of the sampling circuitry during a sampling phase of the analog-to-digital converter:
during the conversion phase, tracking the analog input signal and storing a charge on a precharging capacitor of the precharging circuitry, the charge based on the analog input signal; and
during a precharging transfer phase of the analog-to-digital converter, transferring at least a portion of the charge stored on the precharging capacitor to the sampling capacitor.

12. The method of claim 11, wherein the precharging transfer phase is overlapping with the sampling phase.

13. The method of claim 11, wherein the precharging transfer phase is non-overlapping with the sampling phase.

14. The method of claim 11, further comprising tracking the analog input signal by tracking the output of an auxiliary amplifier configured to receive and buffer the analog output signal.

15. The method of claim 11, further comprising tracking the analog input signal by tracking the outputs of one or more of the main amplifier and an auxiliary amplifier configured to receive and buffer the analog input signal.

16. The method of claim 11, further comprising:
during the conversion phase, storing a respective charge on each of a plurality of precharging capacitors comprising the precharging capacitor of the precharging circuitry, the charge based on the analog input signal; and
during each of a plurality of successive precharging transfer phases comprising the precharging transfer phase, transferring the at least a portion of the charge stored on one of the plurality of precharging capacitors to the sampling capacitor.

17. The method of claim 11, further comprising:
during the conversion phase, tracking the analog output signal and storing the charge differentially on the precharging capacitor and a second precharging capacitor of the precharging circuitry, the charge based on the analog output signal; and
during the precharging transfer phase, placing the precharging capacitor in parallel with the sampling capacitor and the second precharging capacitor in parallel with a second sampling capacitor to transfer the at least a portion of the charge stored on the precharging capacitor to the sampling capacitor and transfer the at least a portion of the charge stored on the second precharging capacitor to the second sampling capacitor.

18. The method of claim 11, further comprising during the conversion phase, tracking the analog input signal by sampling the input analog signal with a delay imposed by a delay element between an input for receiving the input analog signal and input terminals of the amplifier.

19. The method of claim 11, further comprising predicting, based on a current sample of the analog sampled signal, a target value for a next sample of the analog sampled signal, wherein the charge is based on the target value predicted.

20. The method of claim 19, wherein predicting the target value comprises using a differentiator.

* * * * *